United States Patent
Yeh et al.

(10) Patent No.: US 10,217,508 B2
(45) Date of Patent: Feb. 26, 2019

(54) SRAM AND PERIPHERY SPECIALIZED DEVICE SENSORS

(71) Applicant: Synopsys, Inc., Mountain View, CA (US)

(72) Inventors: Tzong-Kwang Henry Yeh, Los Gatos, CA (US); Jamil Kawa, Campbell, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 15/485,220

(22) Filed: Apr. 11, 2017

(65) Prior Publication Data

US 2017/0330613 A1    Nov. 16, 2017

Related U.S. Application Data

(60) Provisional application No. 62/337,290, filed on May 16, 2016.

(51) Int. Cl.
| | |
|---|---|
| *G11C 29/50* | (2006.01) |
| *G11C 11/419* | (2006.01) |
| *H03K 3/03* | (2006.01) |
| *G11C 11/413* | (2006.01) |

(52) U.S. Cl.
CPC .......... *G11C 11/419* (2013.01); *G11C 11/413* (2013.01); *H03K 3/0315* (2013.01); *G11C 29/50* (2013.01)

(58) Field of Classification Search
CPC ....................................... G11C 29/50
USPC ............................................ 365/154, 185.25
See application file for complete search history.

(56) References Cited

U.S. PATENT DOCUMENTS

| | | | |
|---|---|---|---|
| 4,521,698 | A | 6/1985 | Taylor |
| 5,949,270 | A | 9/1999 | Saito |
| 6,154,045 | A | 11/2000 | Ye et al. |
| 9,742,406 | B2 | 8/2017 | Kawa et al. |
| 2003/0080802 | A1 | 5/2003 | Ono et al. |
| 2005/0206430 | A1 | 9/2005 | Choi |
| 2006/0284658 | A1 | 12/2006 | Wright |
| 2008/0116455 | A1 | 5/2008 | Jain et al. |
| 2008/0198677 | A1 | 8/2008 | Son |
| 2010/0322027 | A1 | 12/2010 | Russell et al. |
| 2011/0109361 | A1 | 5/2011 | Nishio |
| 2012/0075918 | A1 | 3/2012 | Arsovski et al. |
| 2014/0269017 | A1* | 9/2014 | Ahmed ................. G11C 29/50 365/154 |
| 2015/0369855 | A1 | 12/2015 | Kawa et al. |

FOREIGN PATENT DOCUMENTS

| | | |
|---|---|---|
| KR | 100231430 B1 | 11/1999 |
| KR | 100336563 B1 | 5/2002 |
| KR | 100762899 B1 | 10/2007 |

* cited by examiner

*Primary Examiner* — Jason Lappas
(74) *Attorney, Agent, or Firm* — HIPLegal LLP; Judith Szepesi

(57) ABSTRACT

A system to enable detection of the process corner of each of the P and N devices of an SRAM array (of bitcells) and of peripheral devices. This permits more focused (optimized and compensated) design of non-SRAM peripheral circuits and of read and write assist circuits for better handling of process distribution impact on circuits improving functionality and yield.

21 Claims, 11 Drawing Sheets

SRAM AND PERIPHERY SPECIALIZED DEVICE SENSORS

RELATED APPLICATION

The present application claims priority to U.S. Provisional Application No. 62/337,290 filed on May 16, 2016, and incorporates that application in its entirety by reference.

FIELD

The present invention relates to on-chip device sensing, and more particularly to SRAM device sensors.

BACKGROUND

Most existing process sensors are targeted towards the chip standard core devices and are ill suited for static random access memory (SRAM) device process corner sensing, because SRAM bitcells do not use standard core devices. Furthermore, the few process sensors designed for sensing SRAMs require "hacking" of the SRAM array and are targeted towards the overall corner of the SRAM and incapable of detecting device skew.

BRIEF DESCRIPTION OF THE FIGURES

The present invention is illustrated by way of example, and not by way of limitation, in the figures of the accompanying drawings and in which like reference numerals refer to similar elements and in which.

DETAILED DESCRIPTION

The sensor compensation system described is designed to accurately characterize in an integrated fashion the process corners of the unique types of P-Devices and N-Devices of a CMOS chip that includes one or more SRAM memory arrays. In one embodiment, the integrated circuit also includes non-SRAM analog and digital devices utilizing core P-Devices and core N-Devices. The sensor compensation system described is used, in one embodiment, to select Read and Write assist strategies of SRAMs.

In one embodiment, the circuit includes two ring oscillators (ROs), a "READ" RO for evaluating N-devices and a "WRITE" RO for evaluating P-devices, an SRAM array, and a control-logic block controlling which RO and which type of device is activated.

In one embodiment, the SRAM array utilized in the evaluation process is a standard SRAM array, and does not need to be subjected to any modification or alteration in order to implement the sensor compensation system of the present application. The SRAM array reflects the standard compilation and usage of an SRAM bit-cell compiled to form an SRAM array. Alternatively, the SRAM array may have any configuration or modification. However, no modification is needed to enable the sensor compensation system, in one embodiment.

The following detailed description of embodiments of the invention makes reference to the accompanying drawings in which like references indicate similar elements, showing by way of illustration specific embodiments of practicing the invention. Description of these embodiments is in sufficient detail to enable those skilled in the art to practice the invention. One skilled in the art understands that other embodiments may be utilized and that logical, mechanical, electrical, functional and other changes may be made without departing from the scope of the present invention. The following detailed description is, therefore, not to be taken in a limiting sense, and the scope of the present invention is defined only by the appended claims.

Figure 1:
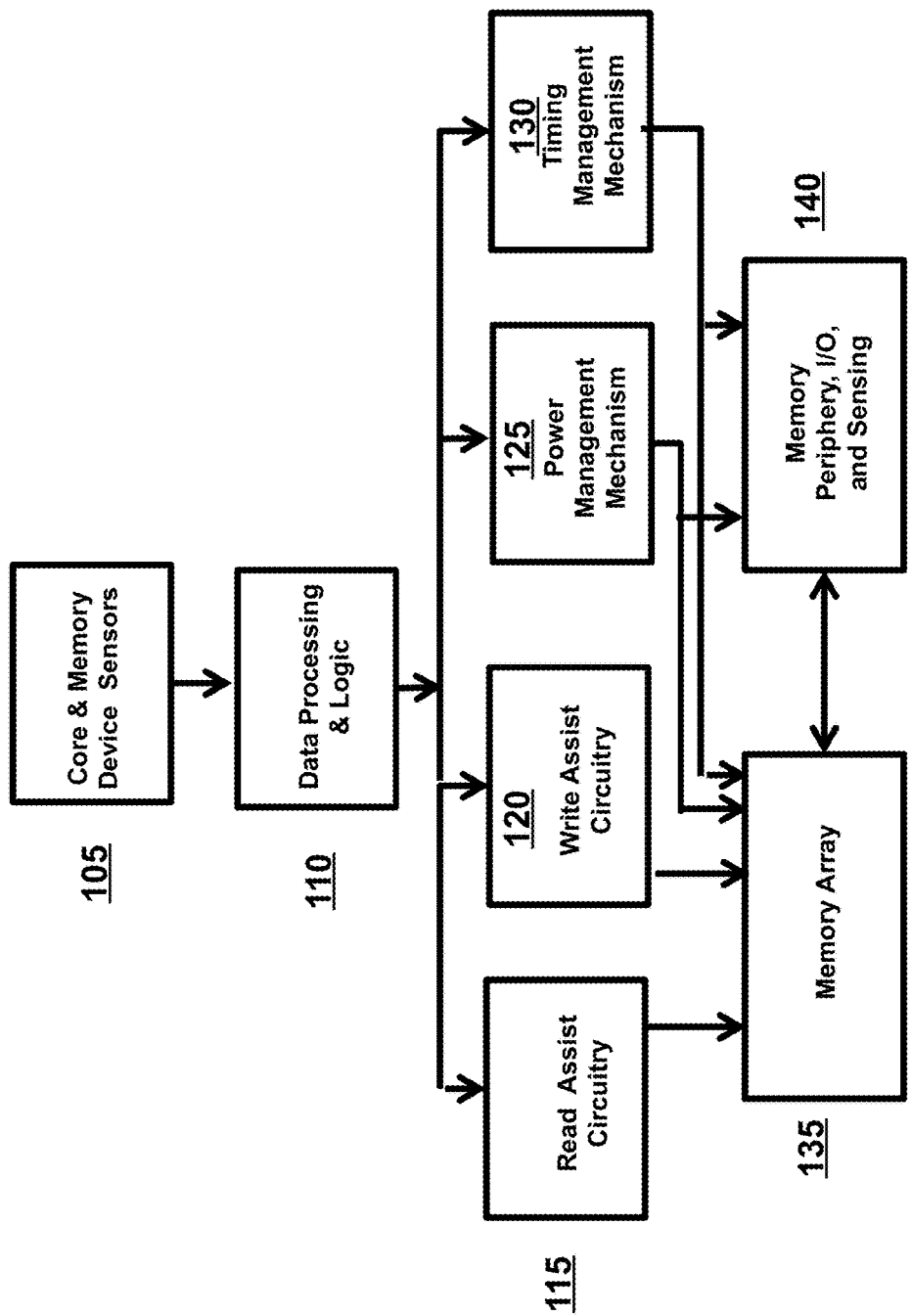
FIG. 1 is block diagram of one embodiment of a system implementation of a sensing, processing and compensation scheme including a plurality of peripheral device and memory sensing modules; sensed data processing and evaluation, and compensation circuitries.

FIG. 1 is a block diagram of one embodiment of the system in which the sensor compensation system may be implemented. The system is used, in one embodiment, to accurately detect the process corner of each of the P and N devices of the chip core and of its memory array. A process corner of a P-device or an N-device represents the extremes of parameter variations within the devices. A design should continue to function at the device corners. In one embodiment, this data can be used for design timing, power adjustments, SRAM memory array compensation in the form of "read-assist" or "write-assist", and/or power and timing management of the SRAM array periphery such as word-line drivers and sense amplifiers.

Block 105 are the core and memory device sensors, including the "READ" RO and the "WRITE" RO for SRAM arrays and for the core and periphery devices. The core & memory device sensors also include the control logic arbitrating which particular RO is active at any one time and the RO output sensors.

The data processing & logic 110, or central processing unit, compares the sensed outputs of the ROs to previous data, which may be pre-stored simulation or silicon based evaluation. The data processing & logic 101 issues control output signals. The control output signals utilize pre-determined logic that interfaces with logic and/or memory blocks for the desired compensation scheme. An example of a system that may implement data processing & logic 110 is the Synopsys SMS (smart memory system) engine, such as the Synopsys DesignWare® Self-Test and Repair (STAR) Memory System®.

Blocks 115, 120, 125, and 130 are representative blocks that can be switched into the circuit by data processing & logic 110. The system may include one or more of the blocks 115, 120, 125, and 130. Blocks 115 and 120 can provide a desired "read-assist" (block 115) and "write-assist" (block 120) for the SRAM memory arrays that are optimal for the sensed process corner. Activating blocks 115 and 120 in one embodiment turns on or off the desired switches in the peripheral blocks supporting the SRAM array. Power management mechanism 125 and timing management mechanism 130 may include word-line drivers, sense amps, and internal timing generators to optimize power consumption (power management mechanism 125) and/or adjust read/write timing windows (timing management mechanism 130). In one embodiment for example, the power management mechanism 125 can reduce power consumed by the peripheral circuits by setting the strength of drivers based on the characterization of the peripheral device. In one embodiment for example, the power management mechanism 125 can optimize WL drive by the peripheral circuits by setting the strength of drivers based on the characterization of the peripheral device.

Blocks 135 and 140 represent a typical compensated embedded SRAM design controlled by the power, timing management, read and write assist circuits which were in turn generated based on the processed data of the memory 135 and peripheral device 140 sensors for optimal performance. One or more of such corrective elements may be used in the system, based on the characterization of the circuit.

Figure 2:
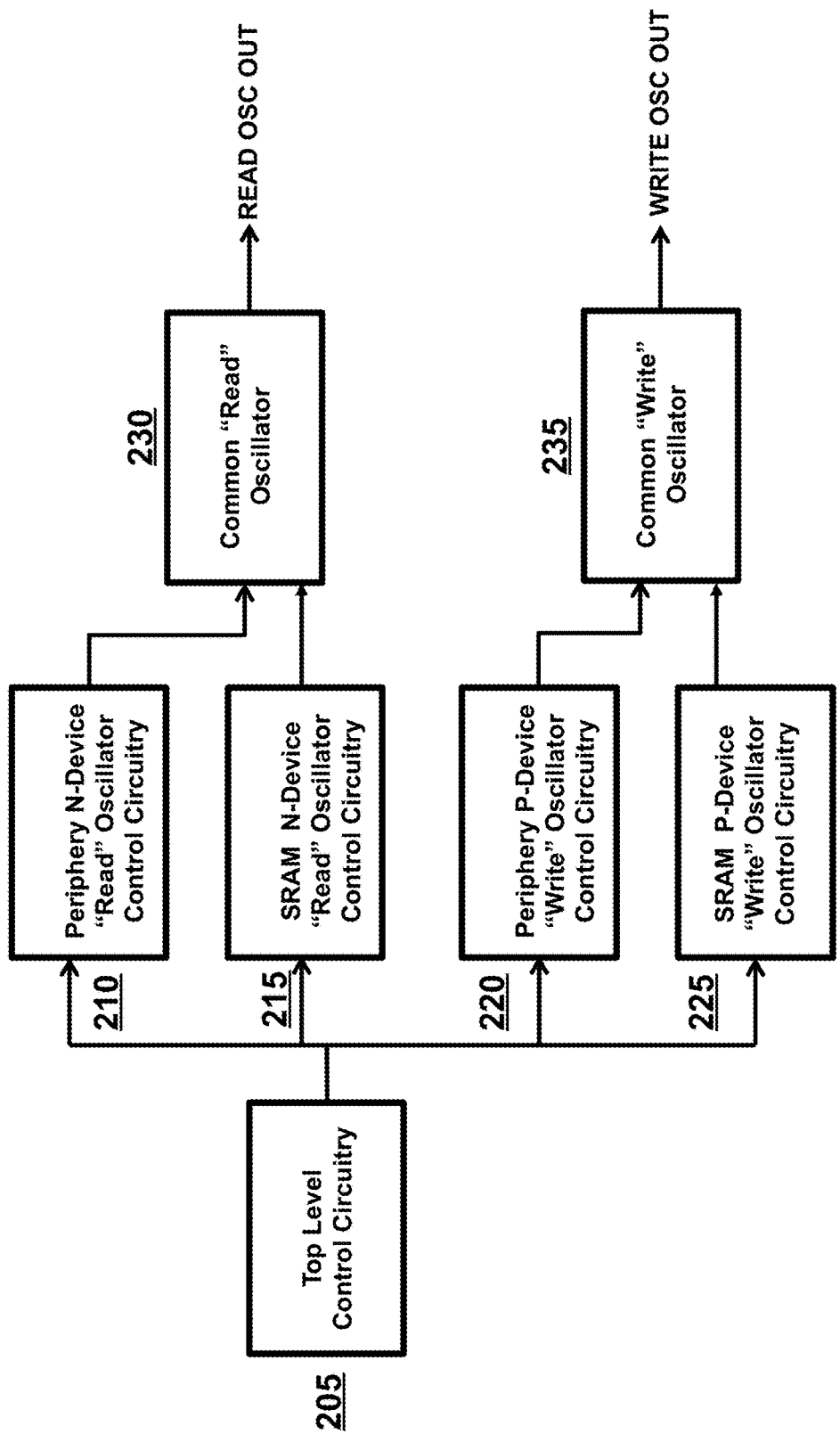
FIG. 2 is a block diagram of one embodiment of the device sensor network of peripheral (core) and SRAM devices.

FIG. 2 is a block diagram of one embodiment of the device sensor network of peripheral (core) and SRAM devices. The top level control circuitry 205 provides control signals to control circuits. These control circuits include, in one embodiment, periphery N-device "read" oscillator control circuitry 210, SRAM N-device "read" oscillator control circuitry 215, both of which output to a common read oscillator 230. Thus, in one embodiment, a single read oscillator 230 reads both the periphery and SRAM N-devices. The output of the common read oscillator 230 is the read oscillation signal, which is used to evaluate the N-devices.

The control circuits include, in one embodiment, periphery P-device "write" oscillator control circuitry 220, SRAM P-device "write" oscillator control circuitry 225, both of which output to a common write oscillator 235. Thus, in one embodiment, a single write oscillator 235 writes to both the periphery and SRAM P-devices. The output of the common write oscillator 235 is the write oscillation signal, which is used to evaluate the P-devices.

Figure 3:
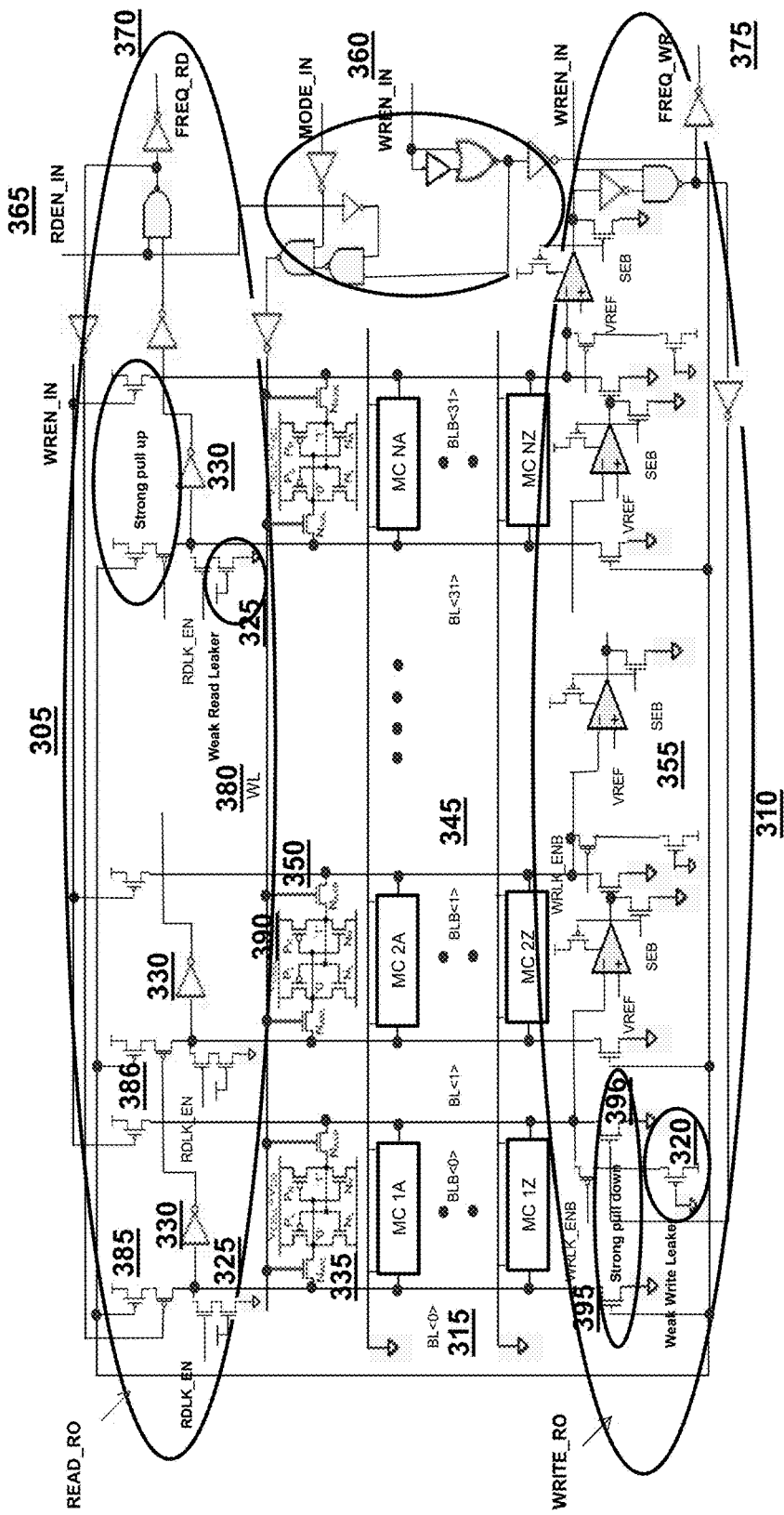
FIG. 3 is a circuit diagram of one embodiment of the device sensor network of peripheral (core) and SRAM devices.

FIG. 3 is a circuit diagram of one embodiment of the sensor network encompassing the "READ RO" 305, the "WRITE RO" 310 and the control logic 360 that determines which RO is active at any one time and whether it is sensing an SRAM array device or a periphery/core device and what type of device.

Block 305 is the main circuit and functionality scheme of one embodiment of the "READ" RO. The oscillating stages of the "READ RO" are implemented in this embodiment with peripheral devices. The bitline (BL) node 315 loads alternating stages of the "READ RO" and discharges (leaking) through the weak N device leaker (325) when a peripheral N-device is being sensed or through the N-devices of the SRAM cell (335) when the SRAM array N-device is being sensed.

The "READ RO" in one embodiment is composed of the alternating controlled stages and simple inverters (330). The frequency of the "READ RO" is output at FREQ_RD (370). The output, in one embodiment, is then digitized and fed to a processing unit (not shown here).

For sensing peripheral N-devices, the gate of the N-device gating the path of the "weak read leaker" (325) is activated (HI) by the control signals RDLK-EN, tied to the gate of the N-device. RDEN_IN (365), MODE_IN, WREN_IN, (360) are configured to enable the P-devices (385 and 386) of the "READ-RO" with source tied to VDD (a strong pull up in this embodiment). The other P-device tied to the drain of P-device 385 is part of the oscillator circuit. Also, with this configuration of the control signals, in one embodiment the WL (380) of the memory array is turned off (LO).

In one embodiment, a stacked inverter is formed in part by P-device 385 and weak read leaker N-device 325 components. The stacked inverter has 2 P-devices and 2 N-devices, in one embodiment. One of the P-devices and one of the N devices are to "gate" the inverter, turning gated N-device OFF when the Read RO is used in Memory mode. In periphery node, gated N-device is turned ON to make the leaky path an inverter and part of the oscillator. However, the P device gated by 385 is a part of the oscillator whether it is the periphery or the SRAM reading mode. The gating N-device is either the "leaker" to the pass gate-pull down combination or to the SRAM.

With this configuration the frequency (speed) of the "READ-RO" is directly impacted by the strength of the "weak read leakers" (325) present in alternating stages of the oscillator. A strong peripheral N-device will translate to a higher leakage current increasing the frequency (speed) of the "READ-RO". Similarly, a weaker peripheral N-device will translate to a lower leakage current reducing the frequency (speed) of the "READ-RO".

In one embodiment, sensing the N-device of the SRAM array utilizes the same configuration as the control logic described above, enabling the "READ-RO" and disabling the "WRITE-RO" with two major differences: the signal RDLK-EN gating the weak leaker is turned off (LO) blocking the path of the weak leaker, and the WL (380) of the memory array is enabled (HI). With this setting the leakage path of the BL (315) of alternating stages is through the enabled SRAM pull-down and pass-gate N-devices (335).

A strong SRAM N-device will translate to a higher leakage current increasing the frequency (speed) of the "READ-RO". Similarly, a weaker SRAM N-device will translate to a lower leakage current decreasing the frequency (speed) of the "READ-RO".

In one embodiment, a "zero" should be written to the memory array prior to the sensing of the SRAM N-devices. In one embodiment, this is achieved through appropriate self-timing implemented through the control logic and the word-line timing.

The "WRITE-RO" (310) operates in a similar fashion to the "READ-RO" (305) described above, with the main difference being that the BLB (bit-line-bar) (350) connected to alternating stages of the "WRITE-RO" (310) is charged through the P-pull-up of the SRAM bitcell (390) for SRAM bitcell P-device detection or through the "weak write leaker" (320) when the peripheral P-Device is being sensed.

Block 310 is the main circuit and functionality scheme of the "WRITE" RO. The oscillating stages of the "WRITE RO" are implemented in this embodiment with peripheral devices. The BLB node (350) loads alternating stages of the "WRITE RO" and charges (leaking) through the weak P device leaker (320) when a peripheral P-device is being sensed or through the P-devices of the SRAM cell (390) when the SRAM array P-device is being sensed.

The "WRITE RO" in one embodiment is composed of alternating controlled stages and simple op-amps (355) performing the role of a "referenced" inverter. The choice of an op-amp in this embodiment is to increase the sensitivity of the inversion to a small amount of BLB (350) charging through the "Weak Write Leaker" (320) in the case of peripheral P-device sensing or through the pull-up/pass gate combination (390) of the SRAM. The frequency of the "WRITE RO" is output at FREQ_WR (375). In one embodiment, it is further digitized and fed to a processing unit (not shown here).

For sensing peripheral P-devices, the control signals RDLK-EN tied to the gate of the N-device gating the path of the "weak read leaker" (325) is de-activated (LO). The signals RDEN_IN (365) MODE_IN, WREN_IN, (360) are configured to enable "WRITE" RO. The BL pull-up device (385), the BLB pull-up device (386) and the N-device (395) are all activated (HI). N-device (396) is tied to the BLB node and is part of the oscillator circuit. Signal WRLK_ENB is turned on (LO) to enable the P-device gating the "weak Write Leaker" (320). With this configuration of the control signals the WL (380) of the memory array is turned off (LO), in one embodiment.

The frequency (speed) of the "WRITE-RO" is directly impacted by the strength of the "weak write leakers" (320) present in alternating stages of the oscillator. A strong peripheral P-device will translate to a higher leakage current increasing the frequency (speed) of the "WRITE-RO" due to faster charging of BLB (345). Similarly, a weaker peripheral P-device will translate to a lower leakage current decreasing the frequency (speed) of the "WRITE-RO".

For sensing the P-device of the SRAM array the same configuration of the control logic described above enabling the "WRITE-RO" and disabling the "READ-RO" is used, with two major differences. The signal WRLK-ENB gating the weak leaker is turned off (HI) blocking the path of the weak leaker, and the WL (380) of the memory array is enabled (HI). With this setting the leakage path of the BLB (345) of alternating stages is through the enabled SRAM pull-up P-device (390) and pass-gate N-devices (350).

A strong SRAM P-device will translate to a higher leakage current charging BLB (345) increasing the frequency (speed) of the "WRITE-RO". Similarly, a weaker SRAM P-device will translate to a lower leakage current decreasing the frequency (speed) of the "WRITE-RO".

One of skill in the art should understand that this is an exemplary configuration of the circuit elements and control signals which make up the sensor compensation system. Various elements may be substituted, as is known in the art, while the essential functionality remains the same. Circuits which were activated high, can be activated low, and vice versa, and various CMOS elements may be substituted with equivalent elements, while remaining within the scope of this disclosure.

Figure 4:
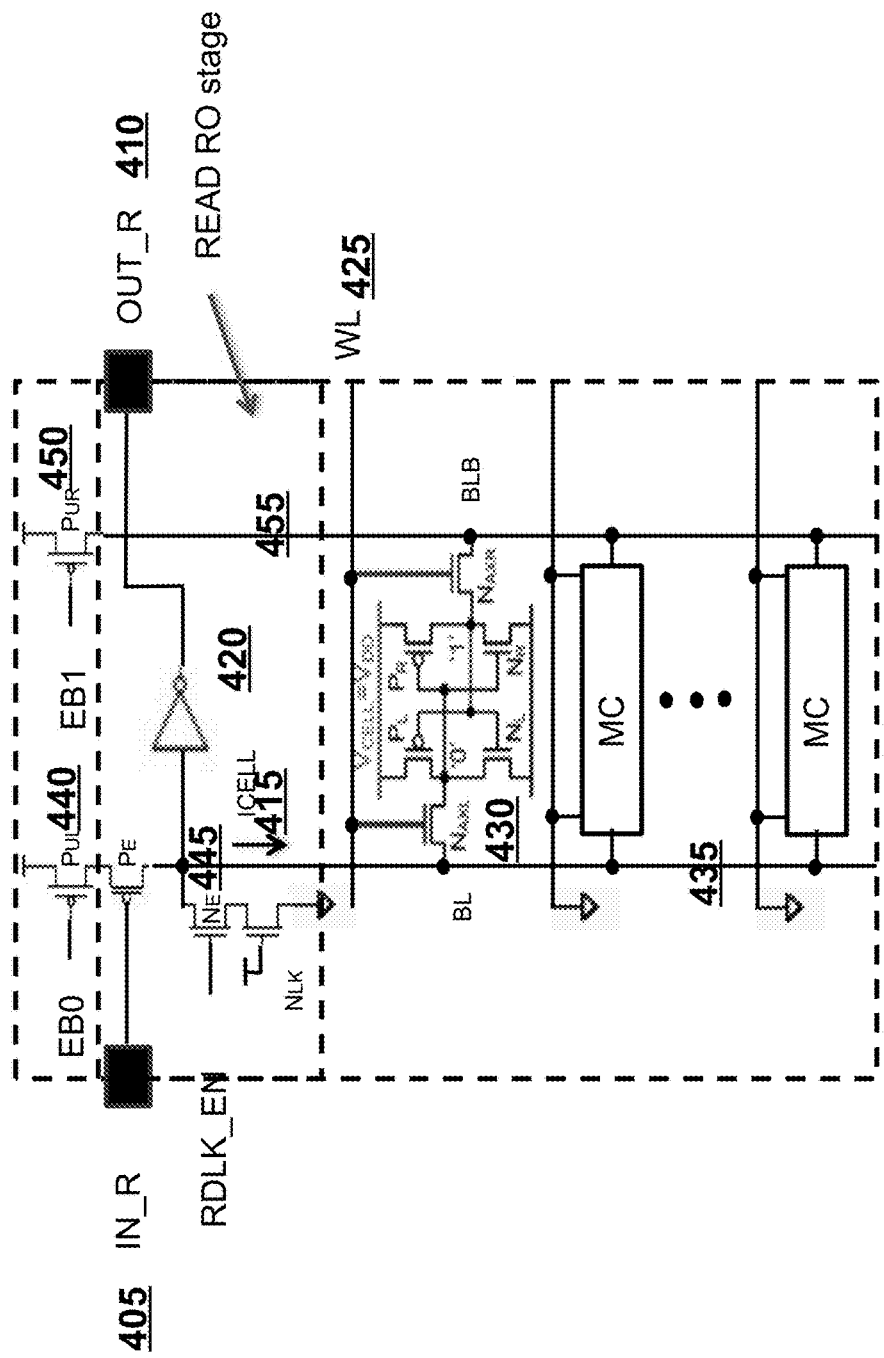
FIG. 4 is a circuit diagram of one embodiment of one stage of a "READ" ring oscillator.

FIG. 4 shows one embodiment of the "READ-RO" block, including the SRAM block (430). The READ-RO block in one embodiment comprises a total of two inversions between the input IN_R (405) and the output OUT_R (410). The first stage is a "gated inverter" where the strong pull-up (440) and the NE pull-down (445) are both turned ON while the word line (WL) (425) is turned off in the peripheral "READ-RO" mode.

In the SRAM "READ-RO" mode, the WL (425) is turned on, the strong pull-up (440) is also turned on, but the NE pull down (445) is turned off.

In both modes, in one embodiment, the BL of the memory array loads the first stage. The second stage 420 is a simple inverter. In one embodiment, there is a gated pull-up PUR (450) to control the pre-charging of the BLB (bit line bar) (455) for cell content stability.

In both modes of "READ-RO" operation the propagation delay of the two stages comprising this block is determined by the rate of leakage of the BL (435) as described in the previous section.

Figure 5:
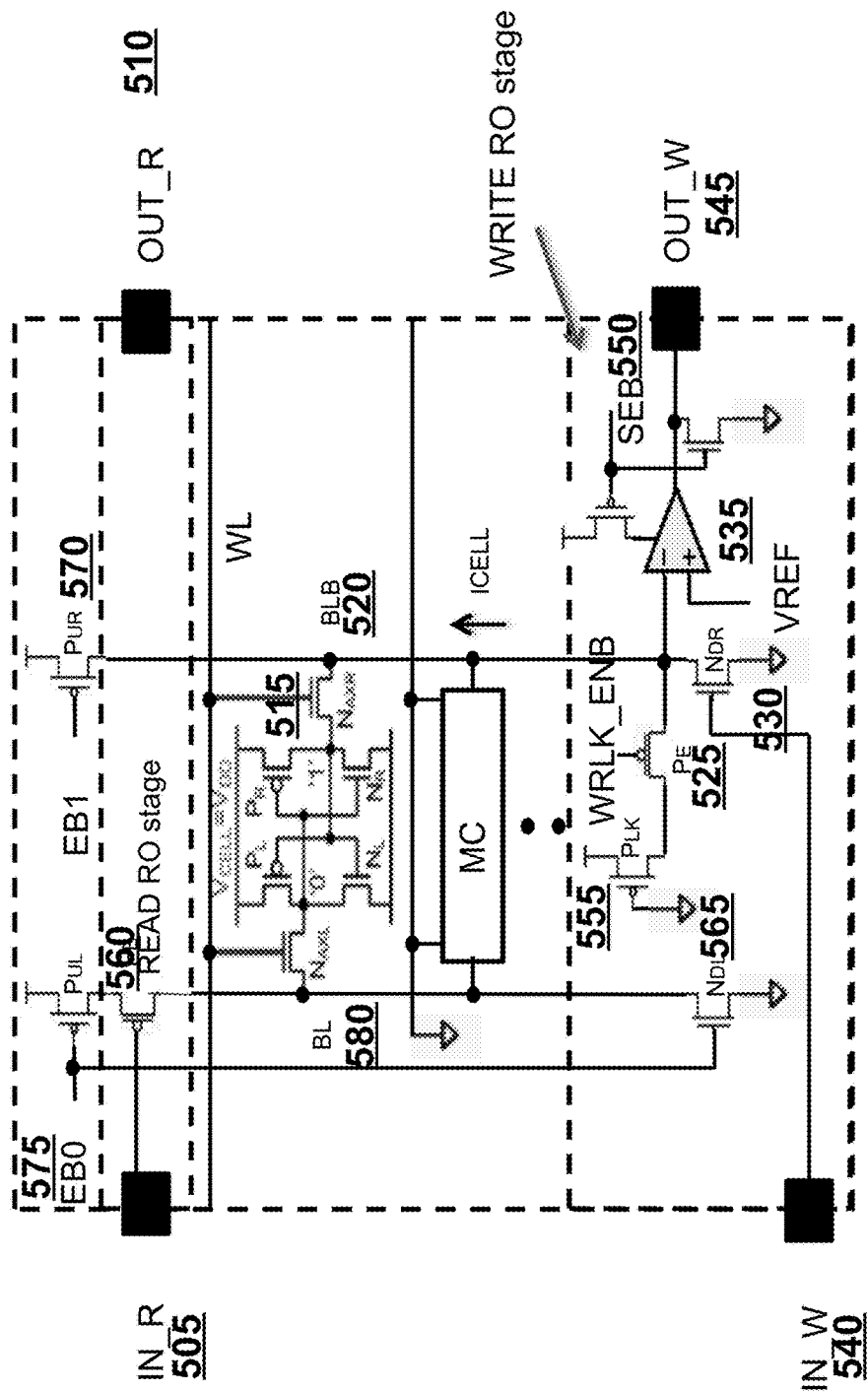
FIG. 5 is a circuit diagram of one embodiment of one stage of a "WRITE" ring oscillator.

FIG. 5 shows one embodiment of one stage of the "WRITE-RO" including an SRAM block. It is composed of two levels of inversions, in one embodiment. The first stage is composed of the inverter with the N-device pull down NDR (530) with input IN_W (540) being the input of the stage, and the pull-up P-device PUR (570) turned off (signal EB1 disabled). The BLB (520) is part of the output of the first inverter, so is the weak leak path composed of the always-on leaker pull-up PLK (555) gated by the pass P-device PE (525) which is enabled when the "WRITE-RO" is in periphery sense mode. The BLB (520) is also tied to the alternative "leak" path of N-device PR and N-device N-AXR (515) of the SRAM bitcell with N-AXR gated by the WL. This leak path is turned off (WL=0) when peripheral "WRITE-RO" is in periphery sense mode and is turned on (WL=HI) when the "WRITE-RO" is in SRAM sense mode.

In one embodiment, the second stage is op-amp (535) with the reference voltage VREF as one of the inputs to the op-amp (535) while the other input is tied to BLB (520), the output of the first stage also sensitive to the "leak path" whether it is through the weak leaker PLK (555) or the pull-up/pass-gate combination (515) of the SRAM bit-cell.

SEB (550) is a power-up/power down control signal for the op-amp (535). In one embodiment, signal EB0 (575) is asserted (HI) to ensure that BL (580) is pulled down through N-device NDL (565) to ensure a "zero" is written into the cell when in write-mode operation.

Figure 6:
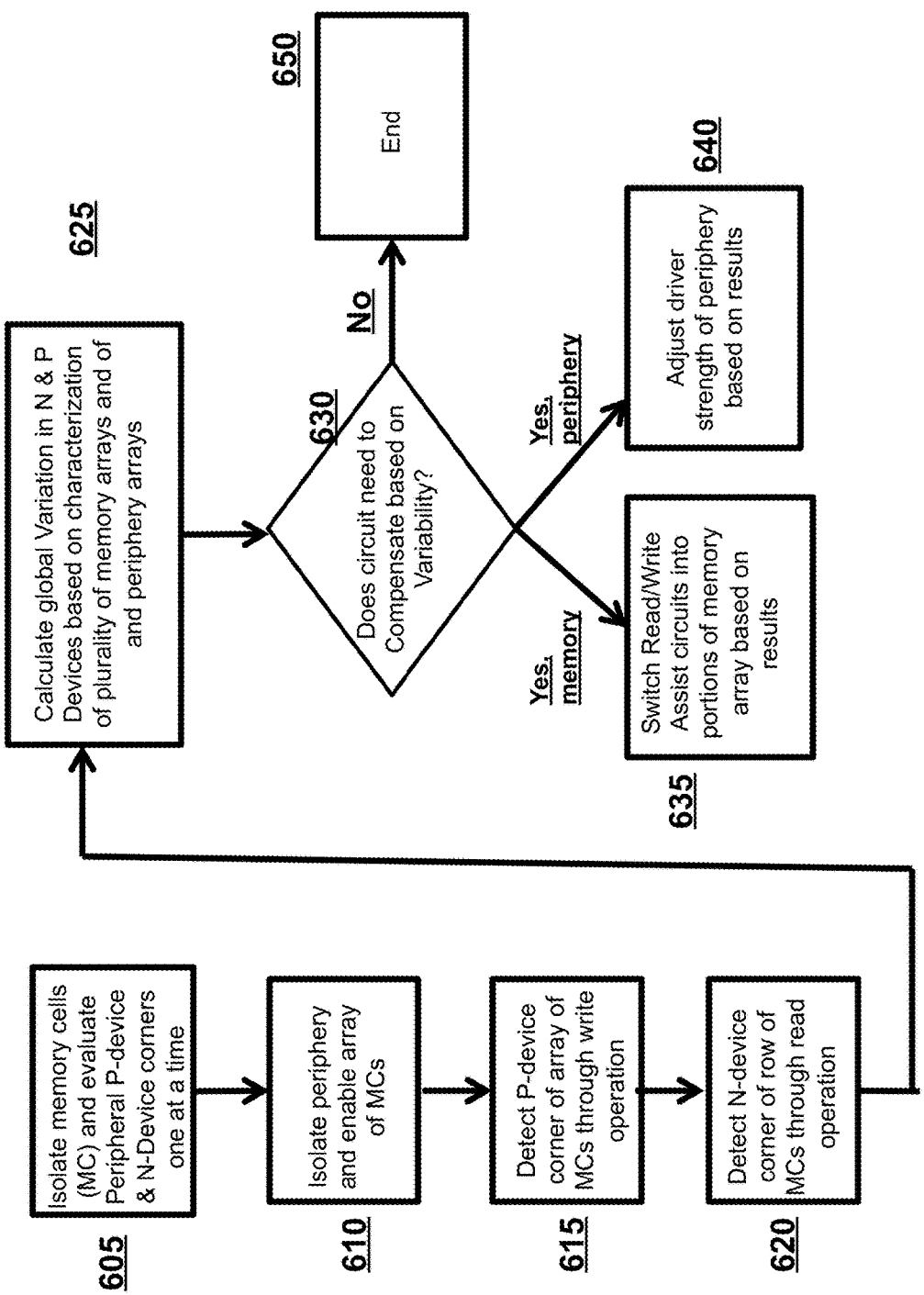
FIG. 6 is a flowchart of one embodiment of the sensing and compensation system incorporating testing N-devices and of P-devices of a memory array and its periphery, of processing the sensed data, and of activating compensation circuitry.

FIG. 6 is a flow chart of one embodiment of using the sensor compensation system. Blocks 605 and 610 stress the fact that the peripheral/core devices and the SRAM array devices are highly un-correlated and therefore the detection of the process corner for the devices of each type should be done in isolation of the other. Block 605 includes isolating the impact of the memory array while evaluating the peripheral devices, and block 610 includes isolating the peripheral devices while evaluating the memory array. This applies to both the P-device and N-device evaluation of core/periphery vs. memory array. The peripheral device corner for the P-device is characterized by pre-charge of a bitline-bar (BLB) through the peripheral P-device to detect the peripheral P-device corner through a pre-charge operation. The peripheral N-device characterized by discharge of the bitline (BL) to detect the peripheral N-device corner through a leak operation.

Block 615 addresses the process of sensing the corner of the P-Device of the memory array. As noted above, this is done with the leakage path of the core P-device core/ periphery isolated. It utilizes a write operation where the strength of the P device of the SRAM bitcell is the dominant factor in determining the speed of the "WRITE-RO". The system characterizes the P-devices of the SRAM by charging the bitline-bar through bit-cell P-devices of the SRAM array, through a write operation.

Block 620 addresses the process of sensing the corner of the N-Device of the memory array. This is done with the leakage path of the N-device of the core/periphery isolated. It utilizes a read operation where the strength of the N devices of the SRAM bitcell is the dominant factor in determining the speed of the "READ-RO". Characterizing the N-devices of the SRAM is done by discharging the bitline through bit-cell N-devices of the SRAM array through a read operation.

Block 625 determines the process corner of each device. In one embodiment, it also determines the deviation from the ideal process corner. In one embodiment, this may be done by an on-chip processor engine (such as Synopsys SMS) that has silicon based data or simulation based data stored in it, that also processes the data sensed by the "READ-RO" and WRITE-RO" for each of the peripheral and SRAM P and N devices. In another embodiment, this may be done by a separate circuit or system.

In one embodiment, the processor may activate control systems to compensate for the variability of the SRAM device, based on the results. In one embodiment, the processor generates various control signals based on pre-determined schemes that control various power, timing, and memory assist control schemes. These control signals are switched into the circuit based on the result of the calculation, to compensate for SRAM and/or or peripheral device issues. This is an example of the functionality of the processor. It is by no means restricted to such functionality.

Blocks 635 and 640 address two typical applications of the use of the sensed data in control and compensation schemes for SRAM arrays and for peripheral/IO circuitry.

Block 630 addresses the use of the sensed strength and process corner of the peripheral and SRAM array device to determine whether the circuit needs to compensate, based on the variability detected for the SRAM array and the periphery. In one embodiment, this may be done by the processor generating control signals that are used in control, adjustment, and compensation schemes for the SRAM arrays such as read and write assist circuits, and for the peripheral logic such as self-timing circuitry, WL drive, and sense amplifier circuits. If no compensation is necessary, the process ends. Otherwise, in one embodiment, it proceeds to block 635, 640, or both, based on the level of compensation identified and the compensatory options available.

Block 635 addresses the use of control signals generated based on the sensed data of the SRAM arrays to determine (by switching circuitry on or off) the magnitude of the read assist and write assist applied. This enhances SRAM yield.

Block 640 addresses the use of control signals generated based on the sensed data of the peripheral devices to determine (by enabling/disabling circuitry) the drive strength of the WL driver, and the timing of the SRAM block. If no compensation is needed, the process ends at block 650.

Figure 7:
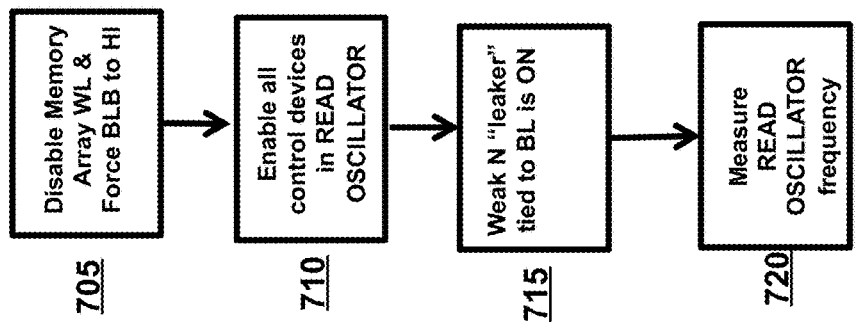
FIG. 7 is a flowchart of one embodiment of a "READ" RO for testing the N-devices of a core (memory periphery) region.

FIG. 7 is a flowchart detailing one embodiment of the procedure for periphery N-device evaluation using a "READ-RO". Block 705 outlines the step of disabling any leakage path through the SRAM ARRAY by switching off all word-lines (WL) addressing the memory. Block 710 outlines the step of enabling all gated devices in the path constituting the "READ-RO" for peripheral sensing. Block 715 notes that the system turns on of the peripheral "weak leaker" devices as outlined above. The "leakage" of nodes connected to BL(s) in the "READ-RO" determines the speed of the "READ-RO". Finally, block 720 describes the process of sensing the frequency of the "READ-RO" at the output of the "READ-RO" as a proxy for sensing the process corner of the peripheral N-device. This frequency is used to evaluate the weak leaker, as was described above.

Figure 8:
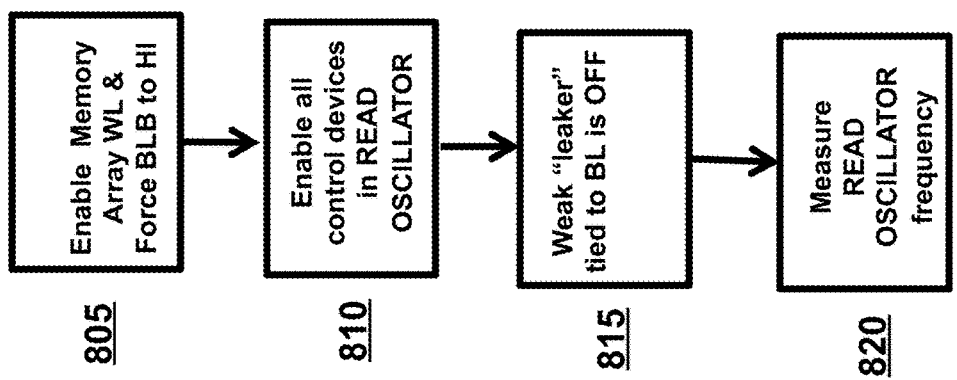
FIG. 8 is a flowchart of one embodiment of a "READ" RO for testing the N-devices of an SRAM memory array.

FIG. 8 is a flowchart detailing one embodiment of the SRAM array N-device evaluation using a "READ-RO". Block 805 outlines the step of enabling the leakage path through the SRAM ARRAY by switching on the word-lines (WL) addressing the memory. Block 810 addresses turning on all the required gated devices in the "READ-RO". Block 815 specifically addressing turning off the "weak leaker" of the peripheral path. Finally block 820 describes the process of sensing the frequency of the "READ-RO" at the output of the "READ-RO" as a proxy for sensing the process corner of the SRAM array N-device.

Figure 9:
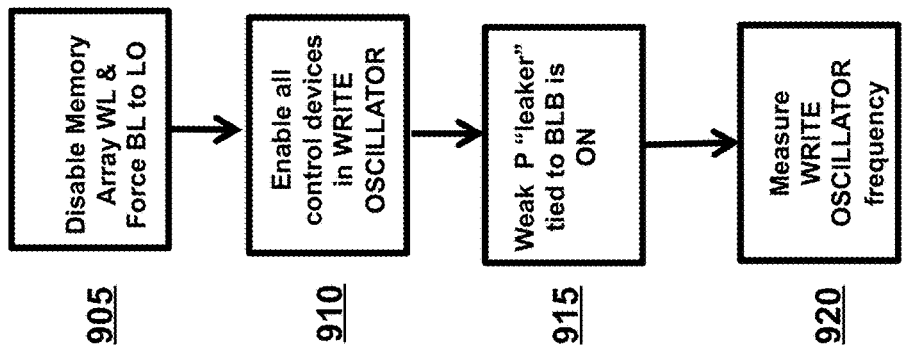
FIG. 9 is a flowchart of one embodiment of a "WRITE" RO for testing the P-devices of a core (memory periphery) region.

FIG. 9 is a flowchart detailing one embodiment of the procedure for periphery P-device evaluation using a "WRITE-RO". Block 905 outlines the step of disabling any leakage path through the SRAM ARRAY by switching off all word-lines (WL) addressing the memory. Block 910 outlines the step of enabling all gated devices in the path constituting the "WRITE-RO" for peripheral sensing. Block 915 emphasizes the turning on of the peripheral "weak leaker" devices as discussed above. The "leakage" of nodes connected to BLB(s) in the "WRITE-RO" determines the speed of the "WRITE-RO". Finally block 920 describes the process of sensing the frequency of the "WRITE-RO" at the output of the "WRITE-RO" as a proxy for sensing the process corner of the peripheral P-device.

Figure 10:
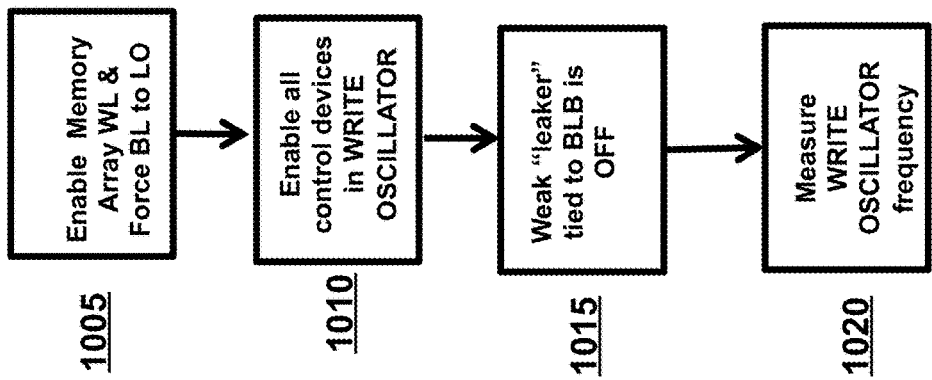
FIG. 10 is a flowchart of one embodiment of a "WRITE" RO for testing the P-devices of an SRAM memory array.

FIG. 10 is a flowchart detailing one embodiment of the SRAM array P-device evaluation using a "WRITE-RO". Block 1005 outlines the step of enabling the leakage path through the SRAM ARRAY by switching on the word-lines (WL) addressing the memory. Block 1010 addresses turning on all the required gated devices in the "WRITE-RO". Block 1015 specifically addressing turning off the "weak leaker" of the peripheral path. Finally block 1020 describes the process of sensing the frequency of the "WRITE-RO" at the output of the "WRITE-RO" as a proxy for sensing the process corner of the SRAM array P-device.

Figure 11:
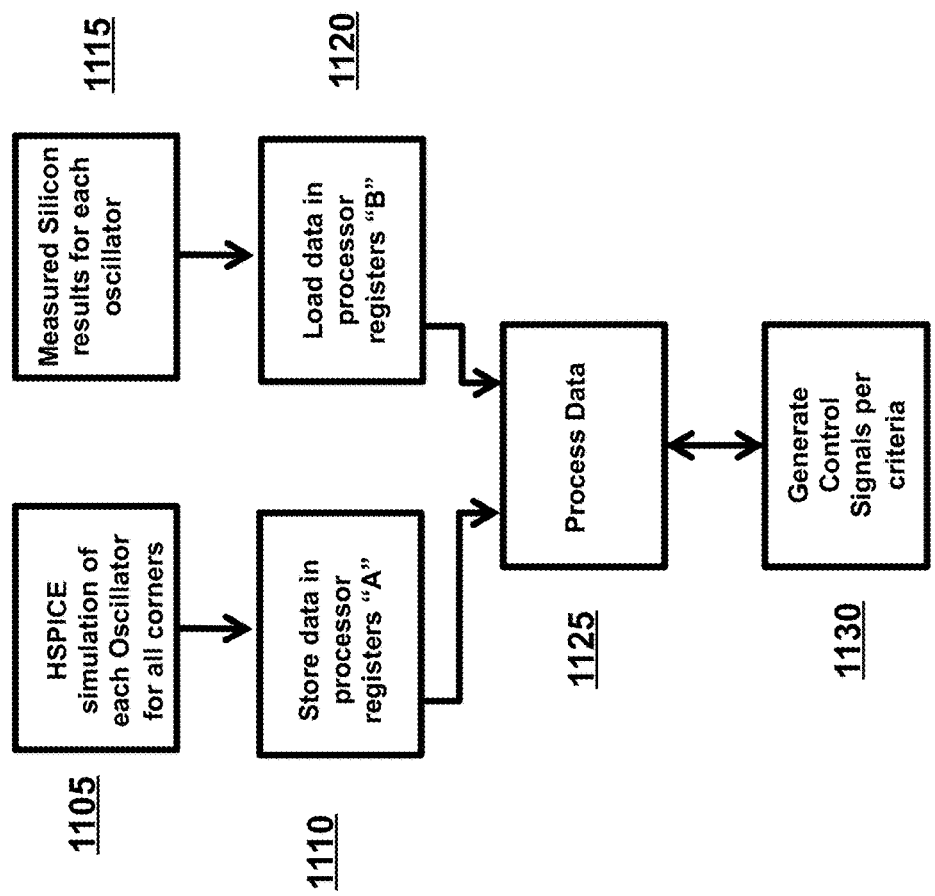
FIG. 11 is a flowchart of the simulation, sensing and processing of data and of the generation of compensation control signals.

FIG. 11 is a flowchart of one embodiment of an overall system that involves simulation of the sensor circuits to establish a reference, sensing silicon, processing the results and, utilizing the processed data to generate compensation and control signals for further use with a CMOS silicon on insulator (SOI) design in general and an SRAM array and its periphery in particular.

Block 1105 reflects the step of using HSPICE (or another circuit simulator, or data from an earlier characterized silicon) to simulate the "READ-RO" and "WRITE-RO" under different global corners, do sensitivity analysis simulations. In one embodiment, this data is used to set references for global corners and derating curves for variation around global corners for both peripheral and SRAM array RO configurations, In one embodiment, this data is stored in the "A" registers of a processor, at block 1110.

Block 1115 reflects silicon characterization of the "READ-RO" and "WRITE-RO" for each of the peripheral and SRAM array devices. In one embodiment, this characterization is the process described above with respect to FIGS. 7-10. In one embodiment, the data is stored in "B" the registers of a processor block 1120.

In block 1125 a processing engine (such as Synopsys SMS) is used to compare the simulation data and the measured results, e.g. the data in the "A" and B" registers. The processing in one embodiment generates variation data analysis and uses designed planned schemes.

Block 1130 reflects the generation of control and compensation signals generated by the processing engine based on the planned scheme. These control signals are used to switch in compensation circuitry or adjust timing, as described above, with respect to FIG. 6, in one embodiment. Although this process has been described in particular with respect to SRAM and periphery devices, one of skill in the art would understand that such evaluations may be made in other types of devices, including memory peripheral systems and supporting logic.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

We claim:

1. An apparatus comprising:
a plurality of peripheral P-devices, the peripheral P-devices characterized by being pre-charged by a bitline-bar (BLB) through the peripheral P-devices to detect a peripheral P-device process corner through the pre-charge operation;
an SRAM array characterized by pre-charging the BLB through P-devices of the SRAM array to detect an SRAM array's P-device process corner through a write operation; and
a write ring oscillator used to characterize the peripheral P-devices and the P-devices of the SRAM array.

2. The apparatus of claim 1, further comprising:
a plurality of peripheral N-devices, the peripheral N-devices characterized by discharge of a bitline (BL) to detect a peripheral N-device process corner through a leak operation;
the SRAM array further characterized by discharging the bitline through bit-cell N-devices of the SRAM array through a read operation; and
a read ring oscillator used to characterize the peripheral N-device and the N-devices of the SRAM array.

3. The apparatus of claim 2, wherein the read operation is through a plurality memory cells along a bitline.

4. The apparatus of claim 2, wherein a plurality of memory SRAM arrays each have an associated peripheral P-device and an associated peripheral N-device, to characterize the plurality of memory arrays.

5. The apparatus of claim 4, wherein a global variation in the N-devices and the P-devices in an integrated circuit is calculated based on the characterization of the plurality of memory arrays.

6. The apparatus of claim 5, further comprising compensating for a local variability impact of SRAM device sensing, based on the plurality of memory arrays.

7. The apparatus of claim 5, further comprising:
a first memory storing simulation data for a simulated SRAM device to establish a reference;
a second memory storing sensed data from characterization of the SRAM array;
a processor to process the simulation data and the sensed data, and to generate control and compensation signals when the processing determines that compensation is needed to compensate for a variability of the SRAM device.

8. The apparatus of claim 4, further comprising:
corrective elements used with the apparatus to compensate for a variability in the memory arrays of an integrated circuit.

9. The apparatus of claim 1, further comprising one or more of:
a read assist circuit, switched into the SRAM array when the characterization indicates that compensation is needed, and a write assist circuit, switched into the SRAM array when the characterization indicates that compensation is needed.

10. The apparatus of claim 1, further comprising:
a power management mechanism to reduce power consumed by a peripheral circuit elements by setting a strength of drivers based on the characterization of the peripheral device.

11. The apparatus of claim 1, further comprising:
a power management mechanism to optimize WL drive by the peripheral circuits by setting a strength of drivers based on the characterization of the peripheral device.

12. The apparatus of claim 1, further comprising:
a control signals to optimize timing circuitry of the SRAM based on the characterization of the peripheral device.

13. A method to characterize an integrated circuit comprising:
characterizing a peripheral P-device, and P-devices in an SRAM array through a precharge and write operation using a write ring oscillator to identify process corners for the peripheral P-device and the P-devices in the SRAM array;
characterizing a peripheral N-device, and N-devices in the SRAM array through a read operation using a read ring oscillator to identify process corners for the peripheral N-device and the N-devices in the SRAM array;
calculating a global variation in the N and P devices in the integrated circuit based on the characterization of a plurality of peripheral N-devices, a plurality of peripheral P-devices, and a plurality of SRAM arrays.

14. The method of claim 13, further comprising:
generating control and compensation signals when the calculating determines that compensation is needed for variability of the SRAM device.

15. The method of claim 13, wherein the read operation is through a plurality memory cells along a bitline.

16. The method of claim 13, further comprising:
calculating a global variation in the N-devices and the P-devices based on the characterization of the plurality of memory arrays.

17. The method of claim 13, further comprising:
compensating for a local variability impact of SRAM device sensing, based on the plurality of memory arrays.

18. The method of claim 13, further comprising:
retrieving simulation data for a simulated SRAM device from memory, the simulation data used to establish a reference;
receiving sensed data from characterization of the SRAM array; and
processing the simulation data and the sensed data to generate control and compensation signals when the processing determines that compensation is needed to compensate for a variability of the SRAM device.

19. The method of claim 13, further comprising one or more of:
switching a read assist circuit into the SRAM array when the characterization indicates that compensation is needed, and a write assist circuit, switched into the SRAM array when the characterization indicates that compensation is needed.

20. The method of claim 13, further comprising:
setting a strength of drivers based on the characterization of the peripheral device to reduce power consumed by a peripheral circuit elements.

21. The method of claim 13, further comprising:
   setting a strength of drivers based on the characterization of the peripheral device to optimize WL drive by the peripheral circuits.

* * * * *